(12) United States Patent
Shimizu

(10) Patent No.: US 6,469,348 B2
(45) Date of Patent: Oct. 22, 2002

(54) NONVOLATILE SEMICONDUCTOR MEMORY DEVICE

(75) Inventor: Satoshi Shimizu, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/847,439

(22) Filed: May 3, 2001

(65) Prior Publication Data

US 2002/0089002 A1 Jul. 11, 2002

(30) Foreign Application Priority Data

Jan. 9, 2001 (JP) ........................................ 2001-001366

(51) Int. Cl.[7] .................. H01L 29/76; H01L 29/94; H01L 31/062; H01L 31/113; H01L 31/119
(52) U.S. Cl. .................. 257/345; 257/346; 257/387; 257/607
(58) Field of Search ......................... 257/288, 407, 257/351, 371, 345, 339, 607, 346, 387, 655; 438/199, 219, 231, 525

(56) References Cited

U.S. PATENT DOCUMENTS 5,557,129 A * 9/1996 Oda et al. .................. 257/345

FOREIGN PATENT DOCUMENTS

| JP | 07-176743 | 7/1995 |
| JP | 08-097293 | 4/1996 |
| JP | 10-022232 | 1/1998 |

OTHER PUBLICATIONS

S.Shimizu, T. Kuroi, Y. Kawasaki, S. Kusunoki, Y. Okumura, M. Inuishi, and H. Miyoshi, "Impact of Surface Proximity Gettering and Nitrided Oxide Side–Wall Spacer by Nitrogen Implantation on Sub–Quarter Micron CMOS LDD FETS," IEEE IEDM vol. 95, 1995, pp. 859–862.
T. Kuroi, S. Shimizu, A. Furukawa, S. Komori, Y. Kawasaki, S. Kusunoki, Y. Okumura, M. Inuishi, N. Tsubouchi, and K. Horie, "Highly Reliable 0.15 $\mu$m MOSFETs with Surface Proximity Gettering (SPG) and Nitrided Oxide Spacer Using Nitrogen Implantation," Symposium on VLSI Technology Digest of Technical Papers, 1995, pp. 19–20.

* cited by examiner

Primary Examiner—David Nelms
Assistant Examiner—Andy Huynh
(74) Attorney, Agent, or Firm—McDermott, Will & Emery

(57) ABSTRACT

A nonvolatile semiconductor memory device according to the present invention includes a semiconductor substrate having a main surface, and a plurality of memory cell transistors which are formed above the main surface via a tunnel oxide film and which have sources and drains. And at least one of the sources and drains include nitrogen so that the oncentration peak is located in the vicinity of the surface.

8 Claims, 15 Drawing Sheets

NONVOLATILE SEMICONDUCTOR MEMORY DEVICE

BACKGROUND OF THE INVENTION

1. Field of the Invention

The present invention relates to a nonvolatile semiconductor memory device and the process for the same, in particular, to a nonvolatile semiconductor memory device and the process for the same that has been improved so as to increase performance and reliability.

2. Description of the Background Art

In recent years, a flash memory, which is a type of nonvolatile semiconductor memory device, has been expected to become widely used as a next generation memory device since it can be manufactured at a lower cost than dynamic random access memories (DRAM).

FIG. 11 is a cross section view of a memory cell part of a conventional flash memory. As shown in FIG. 11, a source 2, connected to a source line, and a drain 3, connected to the corresponding bit line, are provided on the surface of the semiconductor substrate 1.

A floating gate electrode 5 for storing information is provided above the semiconductor substrate 1 with a tunnel oxide film 4 interpolated in between. A control gate electrode 7 connected to the corresponding word line is provided above the floating gate electrode 5 with an interlayer insulating film (for example, a layered film of oxide film/nitride film/oxide film (ONO film)) 6 interpolated in between.

Erasing or writing is carried out by injecting electrons into the floating gate electrode 5 or by extracting electrons stored in the floating gate electrode 5 through the FN (Fowler-Nordheim) current phenomenon, the channel hot electron (CHE) phenomenon, or the like, in the tunnel oxide film 4 located directly beneath the floating gate electrode 5. Due to the condition of the electrons in the floating gate electrode 5, a binary condition of the threshold value is created so that "0" or "1" is read out based on the condition.

Among floating gate type nonvolatile semiconductor memories such as the above flash memories, or EEPROMs, the array configuration which is used most generally is the NOR type array. The NOR type array has contacts formed above the drain diffusion layers of the memory cell transistors of each row and has bit lines formed of metal wires, polycide wires, or the like, in the row direction. That is to say, the NOR type array is in the array configuration where the gate wires of the memory cell transistors of each column and the bit lines are formed in a matrix condition.

FIG. 12 is a circuit diagram showing the NOR type array. FIG. 13 is a diagram showing a layout of the NOR type array.

FIG. 14 is a cross section view along the line 300—300 in FIG. 13. FIG. 15 is cross section view along the line 400—400 in FIG. 13. FIG. 16 is a cross section view along the line 500—500 in FIG. 13. In these figures, bit line contacts are denoted as 8, active regions are denoted as 9, an isolation oxide film is denoted as 10 and an oxide film is denoted as 11.

Referring to these figures, all of the sources 2 of the memory cell transistors of each block (for example, formed of memory cell transistors of 512 Kbits) are connected. At the time when all of the sources 2 are connected in this manner, it is very useful to use the self-aligning source structure for miniaturization of the memory cell transistors.

The self-aligning source structure is not formed in the manner wherein, at the time of connection of the sources 2 of respective memory cell transistors, a contact part is formed above the diffusion layer of each memory cell transistor so that these are connected through a metal wire.

In the self-aligning source technology, first a control gate electrode 7 of a memory cell transistor is formed as shown in FIG. 17 and, after that, a resist 12 is formed in order to make an opening for the source 2 only.

An end part of the resist 12 is formed above the control gate electrode 7. As shown in FIGS. 16 and 17, an isolation oxide film existing above the source 2 is etched and removed by using the resist 12 and the control gate electrode 7 as mask materials.

In addition, As is introduced into the sources 2 through ion injection. Thereby, respective sources 2 are connected through the diffusion layer in the column direction. These are formed through self-alignment. Here, the part shown by a broken line in FIG. 16 represents the isolation oxide film removed through etching.

In the case that all of the sources of the memory cell transistors are formed in the active region and they are connected through a metal wire, room for alignment becomes necessary so that the gate intervals of the sources must be made large.

In the self-aligning source technology, however, since the sources of memory cell transistors are connected through a diffusion layer, the gates sandwiching the sources of the memory cell transistors and the gate intervals can be formed according to the minimum design rule. As a result, the miniaturization of the memory cell transistors can be implemented.

Together with the remarkable scaling down of the design rule in recent years, however, the gate length, which can be formed according to the minimum design rule, has been becoming increasingly shorter in a flash memory to which the self-aligning source structure is applied.

In this case, the short channel effect of the memory cell transistors becomes large and, therefore, the cells do not operate properly according to punch through unless the channel concentration is enhanced or unless the pocket structure (for example, a structure providing a $p^+$ pocket region around an n type source) is adopted.

In the case of n type memory cell transistors, boron (B) is generally used for channel injection or for formation of pocket regions. It is widely known that, in the case that boron is injected excessively, however, a crystal defect 13 occurs in the substrate 1, as shown in FIG. 18, due to the subsequent heat treatment.

As a result, a leak is caused between the source and the drain of the memory cell transistor so as to significantly lower the device performance. In addition, in the case that the crystal defect 13 extends below the tunnel oxide film 4, the reliability, such as endurance, retention, or the like, is significantly lowered.

FIG. 19 shows a process flow in the first prior art from the formation of the first and second layered gates 20a, 20b, as shown in FIG. 18, to the formation of the sidewall spacers.

First, as shown in FIG. 20, the first and second layered gates 20a, 20b are formed. Next, as shown in FIG. 21, a resist 28 for opening the source part of the cell, only, is formed through a photomechanical process. By using the resist 28 as a mask, etching for removing the isolation oxide film and ion injection for converting the removed part into a diffusion layer wire are carried out so as to complete a self-aligned source.

As for the ion injection in this case, As injection for forming the source which is a diffusion layer wire is carried out. In the case of preventing punch through by means of a high concentration injection into the channel, a high concentration injection of boron into the cell part is carried out after the formation of the isolation oxide film and before the formation of the tunnel oxide film 4.

In the case of the cell of the pocket structure, a high concentration injection of boron is carried out in addition to the As injection in the self-aligning source process.

Next, as shown in FIG. 22, the resist 28 is removed and, as shown in FIG. 23, an insulating film 14 is deposited for the formation of the sidewall spacers. After that, as shown in FIG. 24, sidewall oxidation of the floating gate electrode 5 and the control gate electrode 7 is carried out for the purpose of rounding the source edge and drain edge of the floating gate electrode 5. Next, as shown in FIG. 25, the insulating film 14 is etched back and the sidewall spacers 18 are formed.

FIG. 26 is a process flow showing the process of the second prior art. As shown in FIG. 27, the first and second layered gates 20a, 20b are formed so as to complete the self-aligning source process photomechanical process+ etching+ion injection+resist removal).

After that, the sidewall oxidation of the floating gate electrode 5 and the control gate electrode 7 is carried out. Next, an insulating film is deposited, which is etched back. Thereby, sidewall spacers 18 are formed as shown in FIG. 28.

It is necessary for the As injected in the above described self-aligning source process to be injected in high concentration for forming the diffusion layer wire. More concretely, an injection of As of approximately $1 \times 10^{15}$ to $1 \times 10^{16}$ atoms/cm$^2$ is necessary.

After the injection of As these sources (substrate) are almost completely converted into an amorphous condition. In the substrate which is converted into an amorphous condition in this manner, recrystallization is carried out in the subsequent heat processing, for example, at the time of deposition of the insulating film 14 in the first prior art or at the time of sidewall oxidation in the second prior art.

This recrystallization is carried out through both of the growths from the deep (inner) side of the substrate, which has not been converted into an amorphous condition, and from the substrate surface. Accordingly, in the case that boron has been injected in a high concentration, a crystal defect easily occurs in the region where the growths from both areas meet.

In addition, as for an important item with respect to the reliability of a nonvolatile semiconductor memory device, there is resistance against repetition of rewriting.

When repeating writing/erasing in a memory cell transistor, in some cases expected electrons alone are injected/extracted and, in other cases, positive holes are injected into the tunnel oxide film 4 due to the voltage arrangement, or the like. In the latter cases, interface state density is generated in the interface between the tunnel oxide film 4 and the substrate 1 so that there arise the problems that the mobility of the cell effectively becomes smaller and either, or both, of the writing rate or the erasing rate becomes slower.

FIG. 29 shows the endurance characteristics of the above resistance against repetition of rewriting. As shown in this figure, it can be seen that the endurance characteristics have deteriorated.

As described above, in a conventional nonvolatile semiconductor memory device, there is the problem that the reliability is lowered through the occurrence of the above described crystal defects, the generation of the interface state density, or the like.

SUMMARY OF THE INVENTION

This invention is provided to solve the above problem and has the purpose of increasing the reliability of a nonvolatile semiconductor memory device.

A nonvolatile semiconductor memory device according to the present invention includes a semiconductor substrate which has a main surface and a plurality of memory cell transistors which are formed on the main surface via a tunnel insulating film and which have sources and drains, wherein either the sources or drains includes nitrogen of which the concentration peak is located in the vicinity of the surface of either the sources or drains.

By introducing nitrogen into the substrate so that the concentration peak is located in the vicinity of the surface of the sources in the above manner, recrystallization from the substrate surface can be prevented. Thereby, recrystallization can be made to progress from the inside of the substrate so that crystal defects can be prevented from occurring in the inside of the substrate. In addition, by introducing nitrogen into a semiconductor substrate so that the concentration peak is located in the vicinity of the surface of the drains, the generation of the interface state density of a high level in the interface between the tunnel oxide film and the substrate can be prevented.

The above described nonvolatile semiconductor memory device is preferably a NOR type nonvolatile semiconductor memory device. In addition, the sources of the memory cell transistors are preferably electrically connected to each other via an impurity diffusion layer formed in the above main surface.

The present invention is useful for a NOR type nonvolatile semiconductor memory device and, in particular, is useful for a nonvolatile semiconductor memory device which has a so-called self-aligning source structure wherein the sources are electrically connected to each other via an impurity diffusion layer.

The above described concentration peak of the nitrogen is preferably located within 100 nm from the surface of the substrate. More preferably, the concentration peak of the nitrogen is located within 30 nm from the surface of the substrate.

By introducing nitrogen in this range, recrystallization from the surface of the substrate can be effectively prevented so that the occurrence of crystal defects can be prevented. In addition, the generation of a tunnel oxide film and the interface state density of a high level in the interface between the tunnel oxide film and the substrate can be effectively prevented.

The peak concentration of the above nitrogen is preferably $1 \times 10^{19}$ cm$^{-3}$ or more and $1 \times 10^{22}$ cm$^{-3}$ or less. By introducing such a concentration of nitrogen into the surface of the substrate, recrystallization from the surface of the substrate can be effectively prevented and the generation of the above interface state density of a high level can be effectively prevented.

In the case that both of the sources and drains include the above nitrogen, the concentration of the nitrogen included in the sources may be higher than the concentration of the nitrogen included in the drains or the concentration of the nitrogen included in the drains may be higher than the concentration of the nitrogen included in the sources.

In the former case, recrystallization from the surface of the substrate can be selectively controlled and, in the latter case, the generation of the interface state density of a high level in the vicinity of the drains of the memory cells can be selectively prevented.

In addition, the sources alone may include the above nitrogen or the drains alone may include the above nitrogen. Thereby, it becomes useful for a device where either the recrystallization from the surface of the substrate or the generation of the interface state density of a high level may be prevented.

A process for a nonvolatile semiconductor memory device according to the present invention includes the following respective steps. The gates of a plurality of memory cell transistors are formed on the main surface of a semiconductor substrate via a tunnel insulating film. Nitrogen is injected into the formation regions of either the sources or drains of the memory cell transistors so that the concentration peak is located in the vicinity of the surface of either the sources or drains. The sources and the drains are formed in the above main surface.

By injecting nitrogen into the formation regions of either the sources or drains in such a manner that the concentration peak is located in the vicinity of the surface, either the recrystallization from the surface of substrate or the generation of the interface state density of a high level can be prevented as described above.

The above source formation step preferably includes the step of forming a mask layer which exposes the source formation regions and which covers the drain formation regions, the step of removing the isolation insulating film located above the source formation regions by using that mask layer and the step of forming sources by injecting impurities into the source formation regions by using the mask layer. In this case, the step of injecting the above nitrogen preferably includes the step of injecting nitrogen into the source formation regions by using the above described mask layer. That is to say, nitrogen is injected into the surface of substrate in the self-aligning source formation step.

Thereby, nitrogen can be injected in the vicinity of the surface of the sources so that recrystallization from the surface of the substrate can be prevented.

The step of injecting the above nitrogen may include the step of injecting nitrogen into the formation regions of sources and drains by using the gates as a mask.

Thereby, nitrogen can be injected into the vicinity of the surface of the sources and drains so that recrystallization from the surface of the substrate and the generation of the interface state density of a high level can be prevented. At this time, by using the injection of nitrogen in the above described self-aligning source formation step for this objective, the amount of nitrogen injected into the sources can be made greater than the amount of nitrogen injected into the drains so that recrystallization from the surface of the substrate can be selectively prevented.

In addition, the above step of injecting nitrogen may include the step of forming a mask layer which exposes the drain formation regions and which covers the source formation regions and the step of injecting nitrogen into the drain formation regions by using this mask layer.

Thereby, nitrogen can be injected in the vicinity of the surface of the drains so that the generation of the interface state density of a high level can be prevented.

Here, in the case that the injection of nitrogen in the above described self-aligning source formation step and the injection of nitrogen into the drain formation regions are both used, the amount of nitrogen injected into the drain formation regions may be made greater than the amount of nitrogen injected into the source formation regions. Thereby, the generation of the interface state density of a high level can be selectively prevented.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

In the following, embodiments of the present invention are described referring to FIGS. 1 to 10.

First Embodiment

Figure 1:
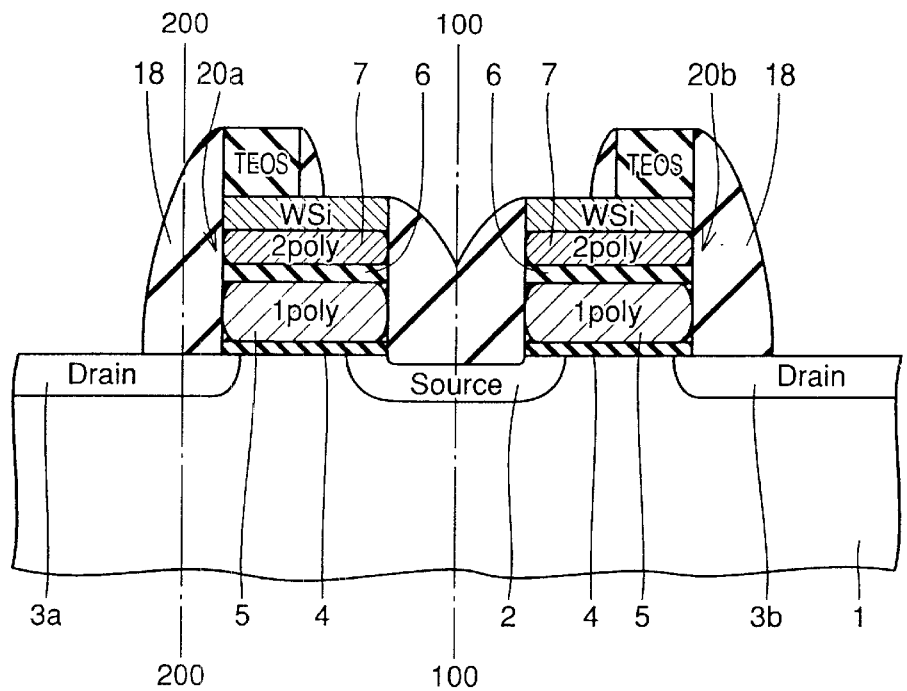
FIG. 1 is a cross section view of a memory cell transistor of a NOR type flash memory according to the present invention.

FIG. 1 is a cross section view of memory cell transistors of a NOR type flash memory (nonvolatile semiconductor memory device) in the first embodiment.

As shown in FIG. 1, a plurality of memory cell transistors are formed on the main surface of a semiconductor substrate 1. Each memory cell transistor has the first or the second layered gate 20a, 20b and the source 2 and the drains 3a, 3b.

The sources 2 are electrically connected to each other via an impurity diffusion layer (not shown) formed on the above main surface. That is to say, the source 2 as shown in FIG. 1 has a so-called self-aligning source structure.

The first and the second layered gates 20a, 20b are formed above the main surface of the semiconductor substrate 1 via a tunnel oxide film 4 and have floating gate electrodes 5 and control gate electrodes 7.

The floating gate electrodes 5 are formed of a first polysilicon film and the control gate electrodes 7 are formed of a second polysilicon film and a tungsten silicide film. An interlayer insulating film 6 is formed between the floating gate electrodes 5 and the control gate electrodes 7 and the interlayer insulating film 6 is, for example, formed of a layered structure of an oxide film, a nitride film and a oxide film (ONO film).

Here, on the sidewalls of the first and the second layered gates 20a, 20b sidewall spacers 18 are formed.

In the present invention, it is an important characteristic that at least one of the source 2 or the drain 3a, 3b include nitrogen so that the concentration peak is located in the vicinity of the surface.

By introducing nitrogen in the main surface of the semiconductor substrate 1 so that the concentration peak is located in the vicinity of the surface of the source 2, recrystallization of the semiconductor substrate 1 starting from the main surface can be constrained.

Thereby, recrystallization can be progressed only from the inside of the semiconductor substrate 1 so that, even if B has existed inside of the semiconductor substrate 1 at a high level of concentration, crystal defects can be prevented from occurring inside of the semiconductor substrate 1.

As a result, a leak current between the source 2 and the drain 3a, 3b as well as a leak current between the source 2 and the semiconductor substrate 1 can be prevented so that the reliability of the memory cell transistors is increased.

In addition, by introducing nitrogen into the main surface of the semiconductor substrate 1 so that the concentration peak is located in the vicinity of the surface of the drain 3a, 3b, the generation of the interface state density in the interface between the tunnel oxide film 4 and the semiconductor substrate 1 due to the injection of positive holes into the tunnel oxide film 4 can be prevented. Thereby, the fluctuation of Vth of a memory cell transistor in accordance with the repetition of rewriting can be constrained so that the endurance characteristics can be improved.

Figure 2:
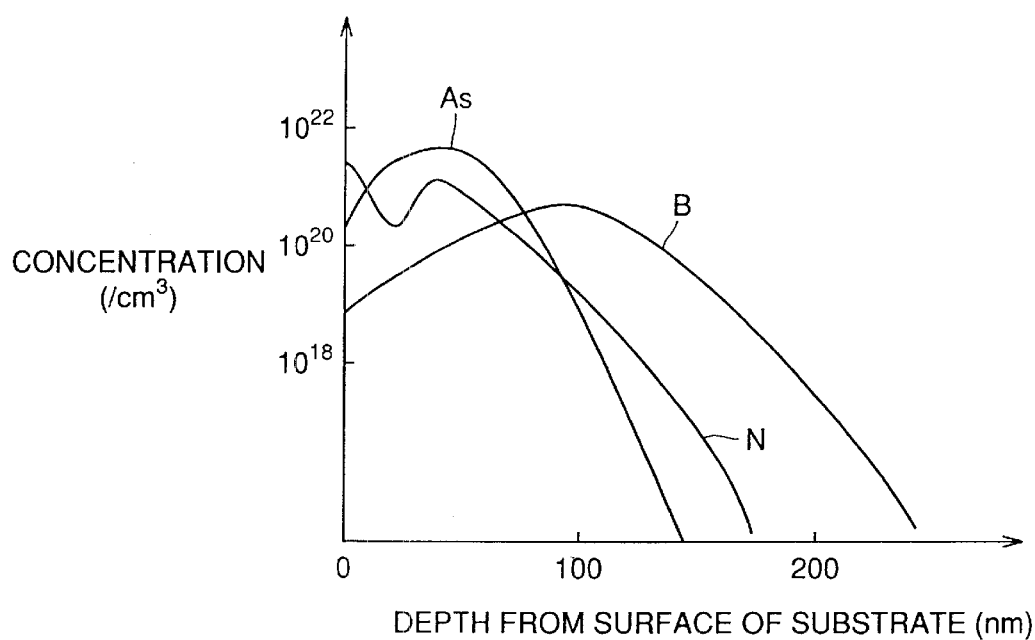
FIG. 2 is a view showing a profile of each element in the cross section along the line 100—100 of FIG. 1 in a memory cell transistor according to a first embodiment of present invention.

FIG. 2 shows a profile of a predetermined element (As, B, N) in a cross section along the line 100—100 in FIG. 1.

As shown in FIG. 2, nitrogen is introduced from the surface of the source 2 to the inside of the semiconductor substrate 1 so that the concentration peak is located in the vicinity of the surface of the source 2. More particularly, the nitrogen concentration has the highest value on the surface of the source 2 and the nitrogen concentration once decreases toward the inside of the semiconductor substrate 1 from the surface of the source 2 and, then, the nitrogen concentration again becomes higher in the vicinity of Rp (projection range) at the time of injection which is in the vicinity of the surface of the source 2 so that the peak of the nitrogen concentration exists in the vicinity of the surface of the source 2 and at a location of a predetermined depth and the nitrogen concentration again decreases toward the deeper part of the semiconductor substrate 1 from this peak location.

The peak of the nitrogen concentration inside of the source 2 is located within 100 nm from the main surface of the semiconductor substrate 1. Preferably, the peak of this nitrogen concentration is located within 30 nm. Thereby, recrystallization of the semiconductor substrate 1 from the main surface can be effectively prevented so that the occurrence of the crystal defects can be prevented.

The peak concentration of nitrogen inside the source 2 is lower than the peak concentration of As for forming the $n^+$ diffusion region and, is higher than the peak concentration of B for forming the $p^+$ pocket region (not shown), which is $1 \times 10^{20}$ cm$^{-3}$ or more and $1 \times 10^{22}$ cm$^{-3}$ or less. Preferably, the peak concentration of nitrogen is $10^{19}$ cm$^{-3}$ or more and $10^{22}$ cm$^{-3}$ or less. By introducing nitrogen of such a concentration in the substrate surface, recrystallization from the substrate surface can be effectively prevented.

Here, nitrogen may be introduced into the drain 3a, 3b so as to have the same profile as the above profile. Thereby, the generation of the interface state density in the interface between the tunnel oxide film 4 and the semiconductor substrate 1 can be effectively constrained.

Figure 3:
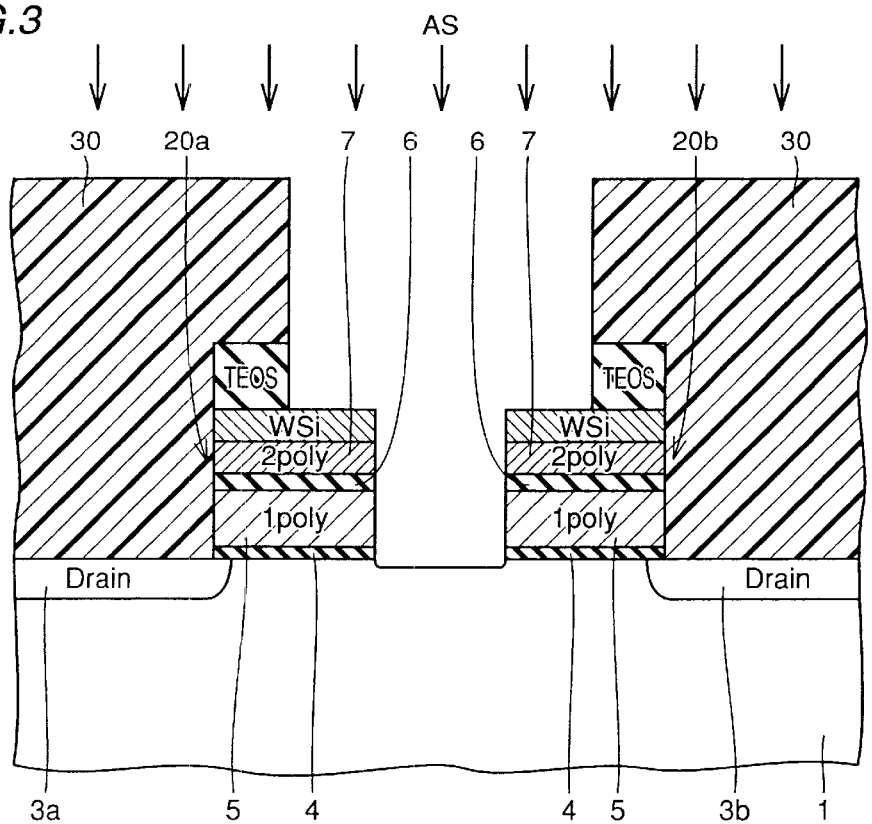
FIGS. 3 to 5 are cross section views showing the first to the third steps of a process for a NOR type flash memory according to the first embodiment of the present invention.
Figure 4:
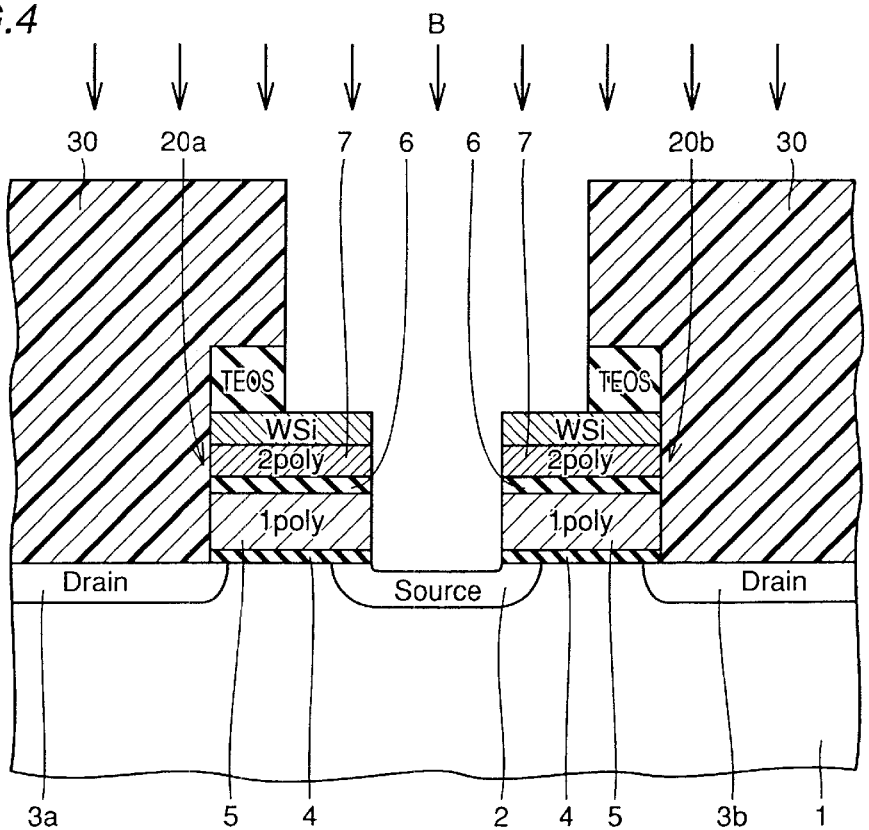
Figure 5:
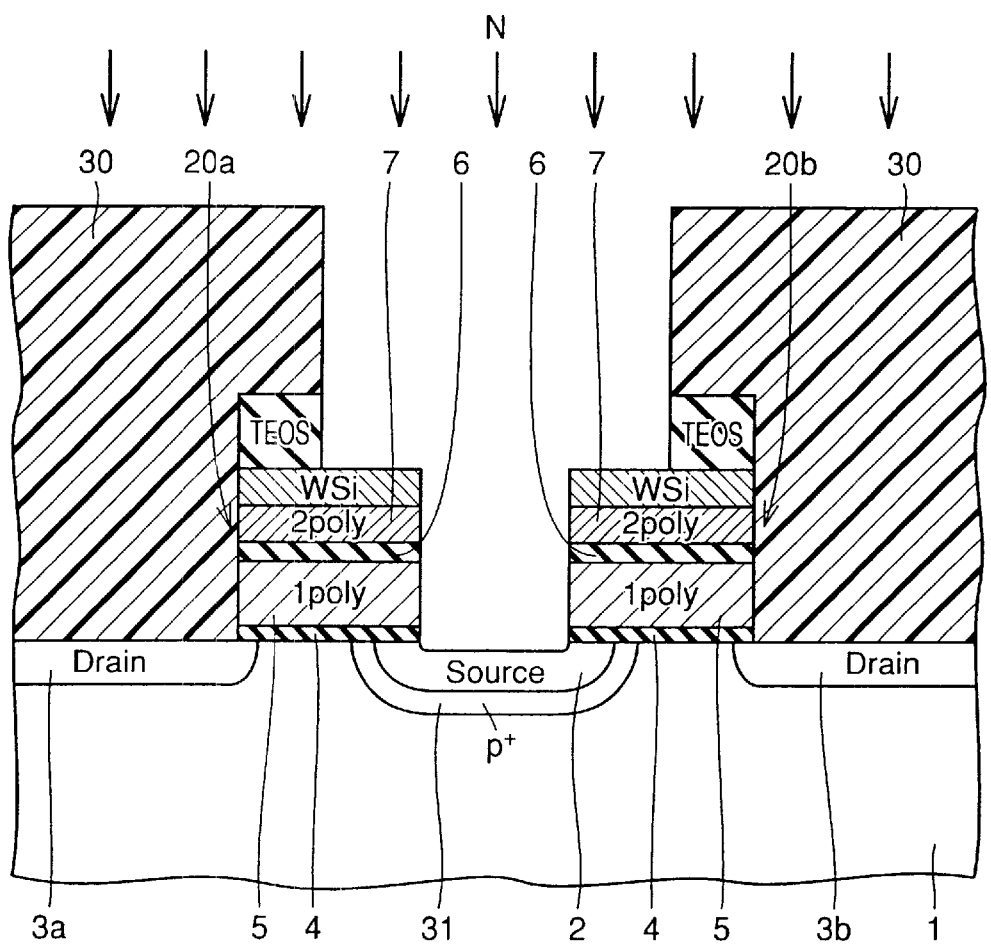

Next, a process for memory cell transistors in a NOR type flash memory of the first embodiment is described referring to FIGS. 3 to 5.

First, the first and the second layered gates 20a, 20b are formed above the main surface of the semiconductor substrate 1 via the tunnel oxide film 4 by means of a well known method and the drains 3a, 3b are formed by injecting predetermined impurities into the main surface of the semiconductor substrate 1. Next, as shown in FIG. 3, a resist 30, wherein an aperture is created only for a region for forming the source 2 of the memory cell transistor, is formed in a photomechanical process.

By carrying out dry etching through usage of this resist 30 as a mask, a part of the isolation oxide film which is to become a diffusion layer wire (source 2) is removed. Next, as shown in FIG. 3, As injection is carried out by using the resist 30 as a mask under the conditions of 15 keV to 70 keV, dose amount of $1 \times 10^{15}$/cm$^2$ to $1 \times 10^{16}$/cm$^2$. Thereby, as shown in FIG. 4, the $n^+$ diffusion region, which is to become the source 2, that is to say, the self-aligning source structure is formed.

Next, as shown in FIG. 4, B injection is carried out by using the resist as a mask under the conditions of 15 keV to 70 keV and the dose amount of $1 \times 10^{14}$/cm$^2$ to $1 \times 10^{15}$/cm$^2$. Thereby, as shown in FIG. 5, a $p^+$ diffusion region (pocket region) 31 surrounding the source 2 can be formed so that the punch through of the memory cell transistor can be prevented.

Next, as shown in FIG. 5, by using the resist 30 as a mask, at a low energy level of, for example, approximately 0.5 keV to 40 keV, nitrogen of approximately $5 \times 10^{14}$/cm$^2$ to $5 \times 10^{16}$/cm$^2$ is injected aiming at the main surface of the semiconductor device 1. Thereby, nitrogen can be injected into the semiconductor substrate 1 so as to have the profile as shown in FIG. 2. Here, this nitrogen injection may be carried out before the As injection or the B injection.

After that, an insulating film is deposited for the formation of the sidewall spacers. Sidewall oxidation of the floating gate electrode 5 and control gate electrode 7 is carried out and the sidewall spacers 18 are formed by etching back the above described insulating film. Through the above steps, memory cell transistors as shown in FIG. 1 can be formed.

Second Embodiment

Figure 6:
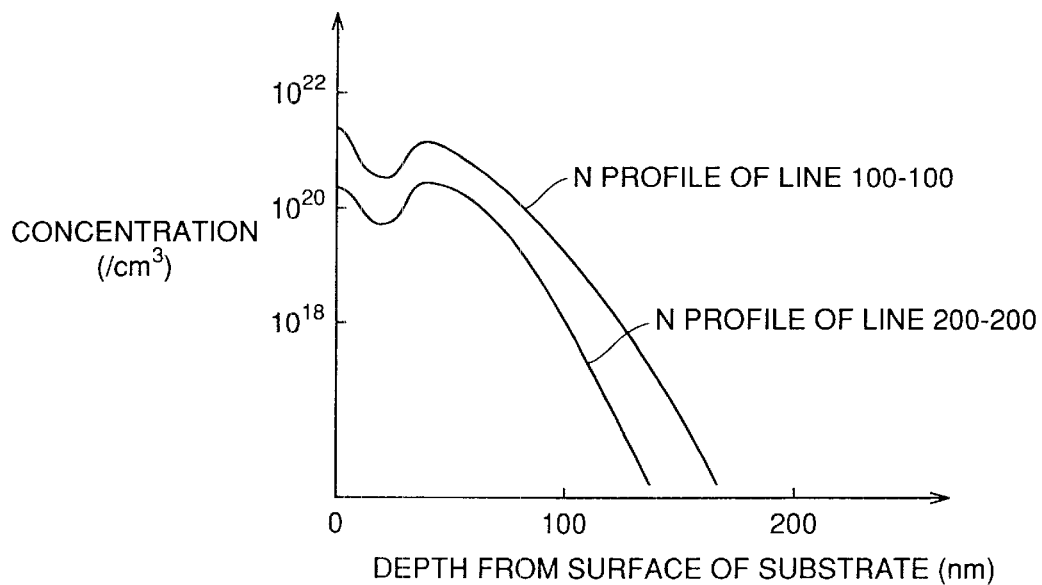
FIG. 6 is a view showing profiles of nitrogen in the cross section along the lines 100—100, and 200—200 of FIG. 1 in a memory cell transistor according to a second embodiment of the present invention.
Figure 7:
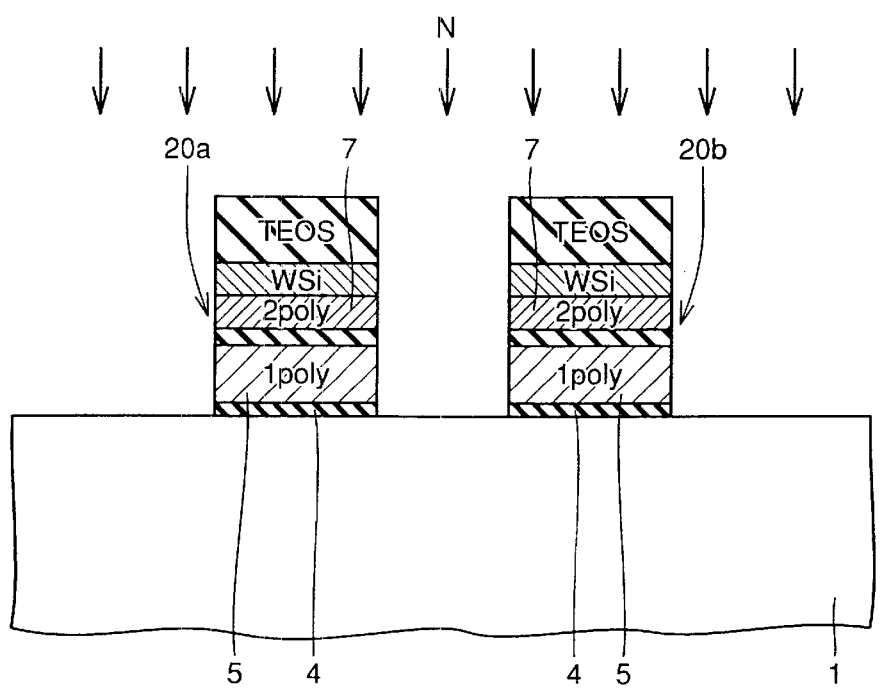
FIG. 7 is a cross section view showing a characteristic process of a NOR type flash memory according to the second embodiment of the present invention.

Next, the second embodiment of the present invention is described referring to FIGS. 6 and 7. In the second embodiment, nitrogen is introduced into both of the source 2 and the drains 3a, 3b. Thereby, the generation of the interface state density in the interface between the tunnel oxide film 4 and the semiconductor substrate 1 can be prevented while constraining recrystallization of the semiconductor substrate 1 from the main surface.

As shown in FIG. 6, it can be seen that any profiles of nitrogen in the source 2 and the drains 3a, 3b show the same tendency of the profile of the nitrogen in the first embodiment as shown in FIG. 2.

In addition, in an example as shown in FIG. 6, the nitrogen concentration included in the source 2 is higher than the nitrogen concentration included in the drains 3a, 3b. Thereby, recrystallization of the semiconductor substrate 1 from the main surface can be selectively prevented.

Accordingly, the second embodiment is useful for a memory cell structure, wherein crystal defects of the source 2, rather than the deterioration of the endurance characteristics due to the occurrence of the interface status density, cause a great inconvenience.

Next, referring to FIG. 7, a process for memory cell transistors in a NOR type flash memory of the second embodiment is described.

In the same manner as in the case of the first embodiment, the first and the second layered gates 20a, 20b are formed on the main surface of the semiconductor substrate 1 by means of a well known method, and nitrogen of approximately $5 \times 10^{14}/cm^2$ to $5 \times 10^{16}/cm^2$ is injected aiming at the main surface of the semiconductor substrate 1 at a low energy level of, for example, approximately 0.5 keV to 40 keV.

Next, in the same method as in the first embodiment, the isolation oxide film in the part which is to be a diffusion layer wire is removed and As injection, B injection and nitrogen injection to the source 2 are carried out. Thereby, nitrogen can be introduced into the main surface of the semiconductor device 1 so as to have the profile as shown in FIG. 6.

Here, in the case that no nitrogen injection is carried out in the self-aligning source formation step, the nitrogen concentrations included in the source 2 and the drains 3a, 3b become equal. In addition, in the case that the self-aligning source formation step itself is not carried out, the same result is gained.

Third Embodiment

Figure 8:
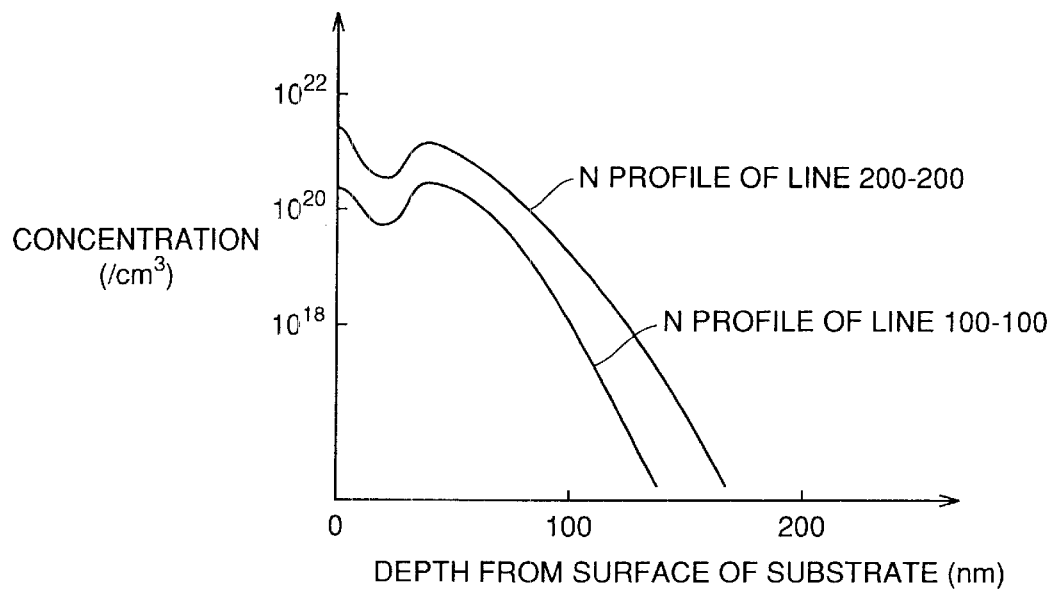
FIG. 8 is a view showing profiles of nitrogen in the cross sections along the lines 100—100 and 200—200 of FIG. 1 in a memory cell transistor according to a third embodiment of the present invention.
Figure 9:
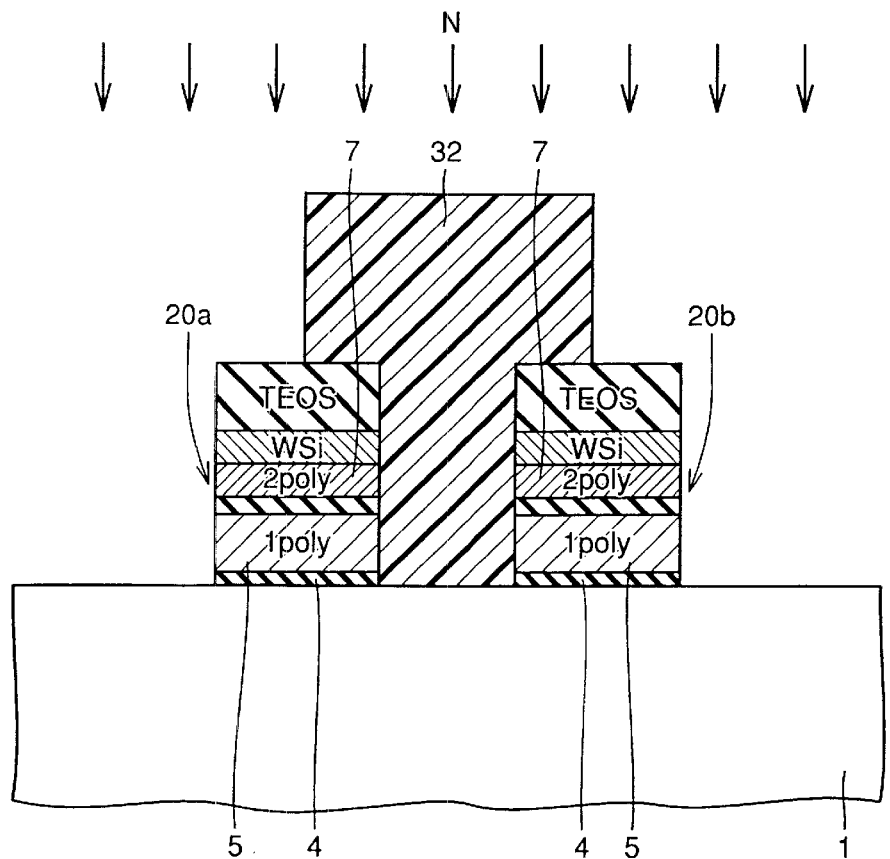
FIG. 9 is a cross section view showing a characteristic process of a NOR type flash memory according to the third embodiment of the present invention.

Next, referring to FIGS. 8 and 9, the third embodiment according to the present invention is described. In the third embodiment, nitrogen is introduced into both of the source 2 and the drains 3a, 3b.

In addition, in the case of the third embodiment, as shown in FIG. 8, it can be seen that nitrogen profile in either of the source 2 and the drain 3a, 3b show the same tendency as of the profile of nitrogen in the first embodiment as shown in FIG. 2.

In the third embodiment, the nitrogen concentration included in the drains 3a, 3b as shown in FIG. 8 is set higher than the nitrogen concentration included in the source 2. Thereby, the generation of the interface status density in the interface between the tunnel oxide film 4 and the semiconductor substrate 1 can be selectively prevented.

Accordingly, the third embodiment is useful for a memory cell structure wherein the deterioration of the endurance characteristics is great because of the occurrence of the interface status density rather than the inconvenience due to the crystal defects of the source 2.

Next, referring to FIG. 9, a process for memory cell transistors in a NOR type flash memory according to the third embodiment is described.

In the same manner as in the case of the first embodiment, the first and the second layered gates 20a, 20b are formed on the main surface of the semiconductor substrate 1 by means of a well known method, and a resist 32 which covers a region for the formation of the source 2 and which exposes regions for the formation of drains 3a, 3b as shown in FIG. 9 is formed on the main surface of the semiconductor substrate 1 in a photomechanical process.

By using this resist 32, the first and the second layered gates 20a, 20b as a mask, nitrogen of approximately $1 \times 10^{15}/cm^2$ to $2 \times 10^{16}/cm^2$ is injected aiming at the main surface of the semiconductor substrate 1 at a low energy level of, for example, approximately 0.5 keV to 40 keV.

Next, in the same method as in the first embodiment, a part of the isolation oxide film, which is to become the diffusion layer wire, is removed and As injection, B injection and nitrogen injection into the source 2 are carried out. Thereby, nitrogen can be introduced into the main surface of the semiconductor substrate 1 so as to have the profile as shown in FIG. 8.

Here, though in the third embodiment, nitrogen injection is carried out before the self-aligning source formation step, the nitrogen injection may be carried out after the self-aligning source formation.

Fourth Embodiment

Figure 10:
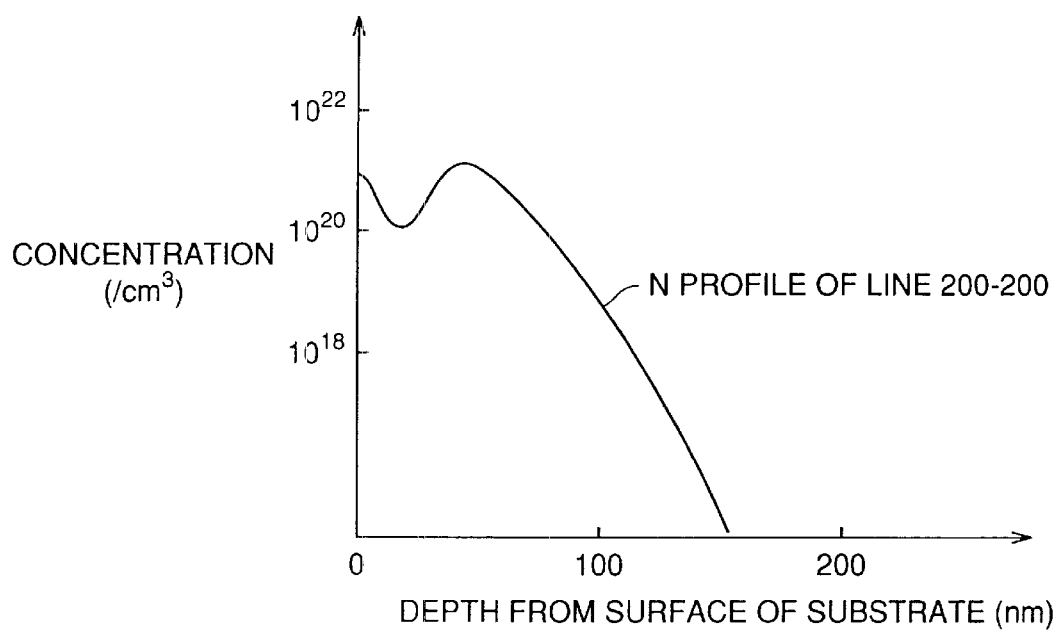
FIG. 10 is a view showing a profile of nitrogen in the cross section along the line 200—200 of FIG. 1 in a memory cell transistor according to a fourth embodiment of the present invention.
Figure 11:
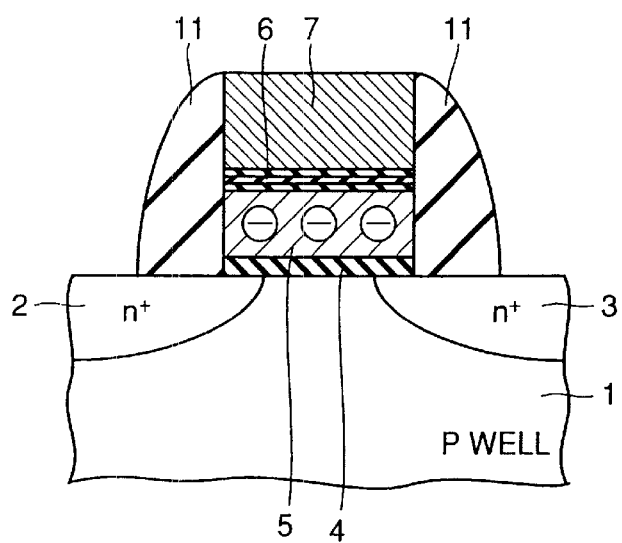
FIG. 11 is a cross section view of a flash memory according to a prior art.
Figure 12:
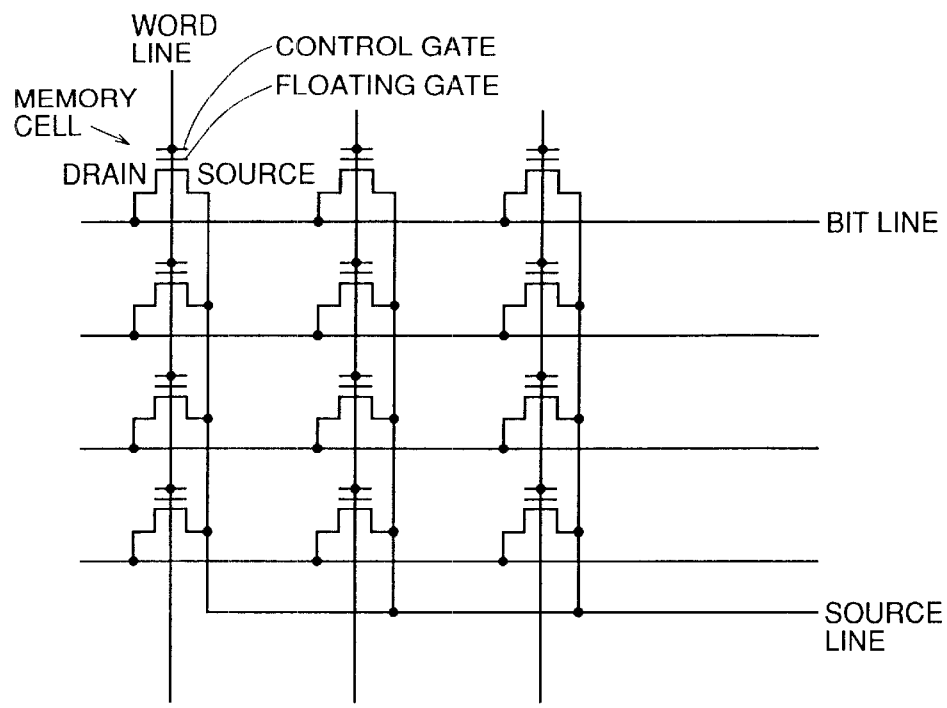
FIG. 12 is a view showing an array configuration of a NOR type flash memory according to a prior art.
Figure 13:
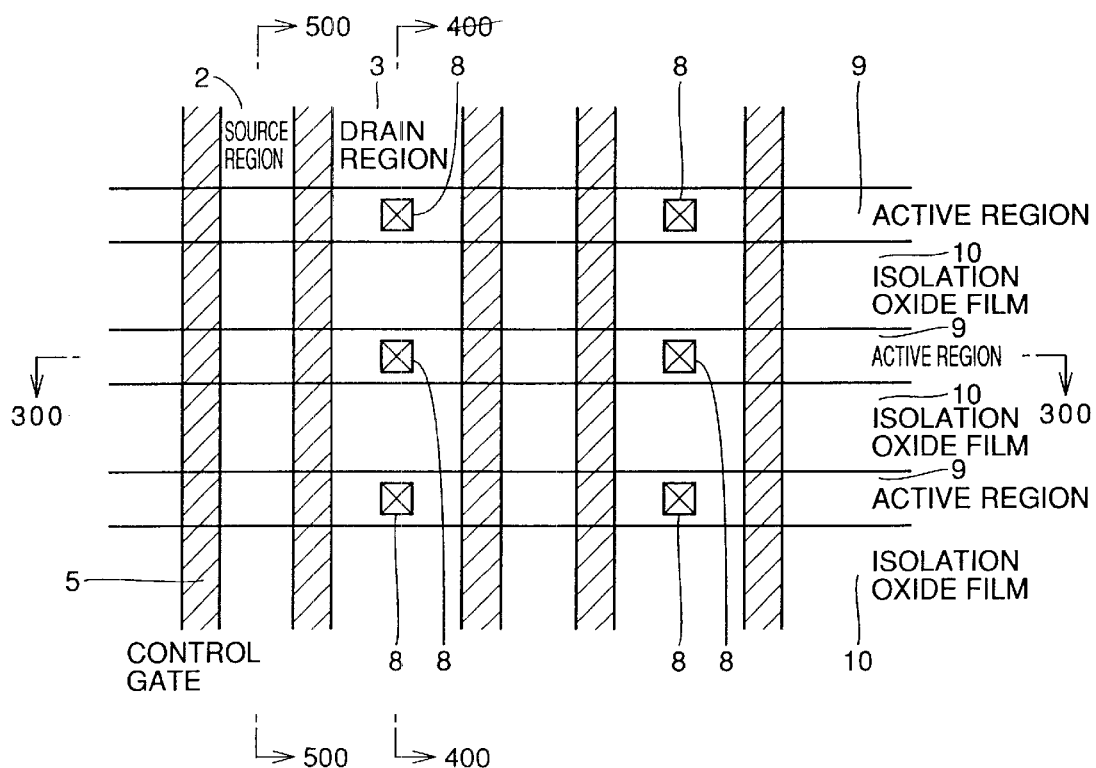
FIG. 13 is a view showing an array layout of a NOR type flash memory according to a prior art.
Figure 14:
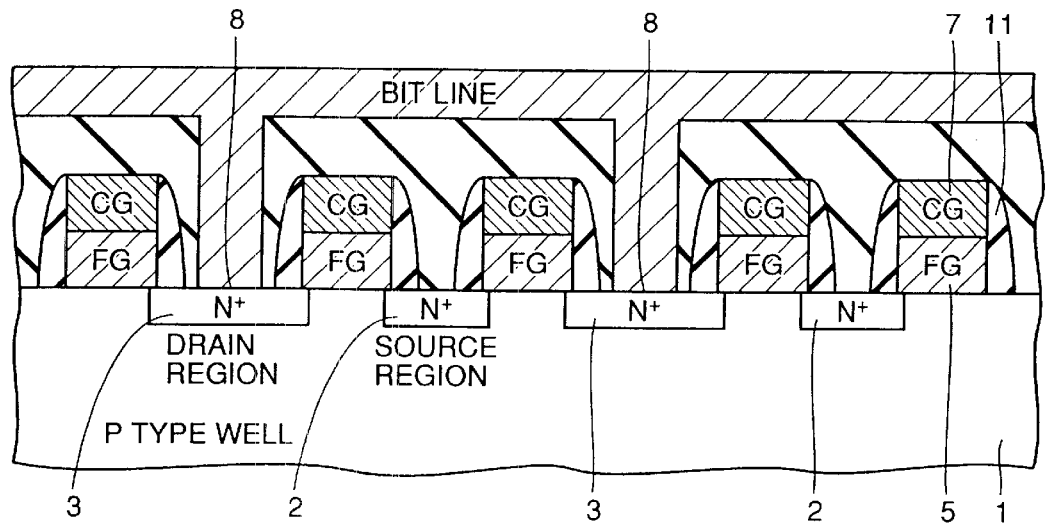
FIG. 14 is a cross section view along the line 300—300 in FIG. 13.
Figure 15:
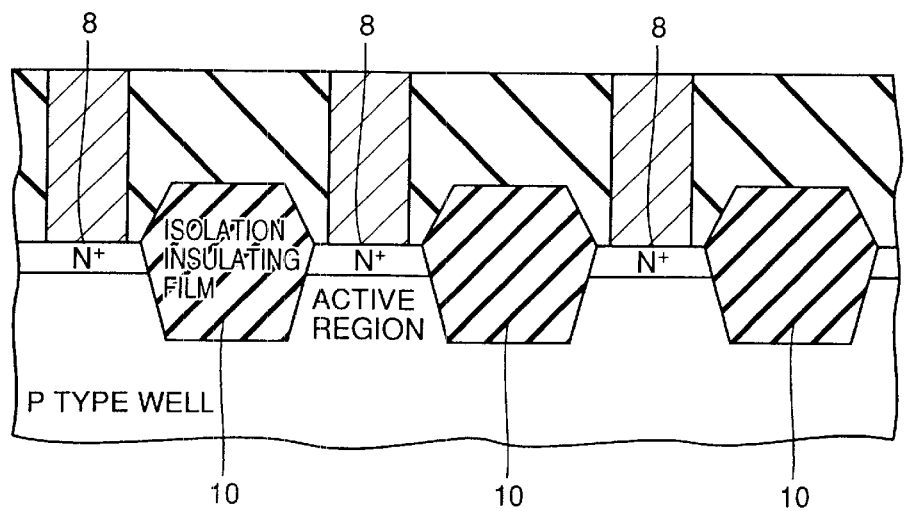
FIG. 15 is a cross section view along the line 400—400 in FIG. 13.
Figure 16:
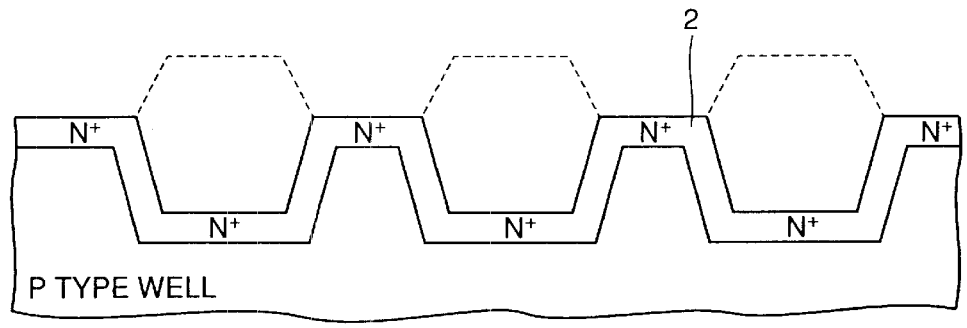
FIG. 16 is a cross section view along the line 500—500 in FIG. 13.
Figure 17:
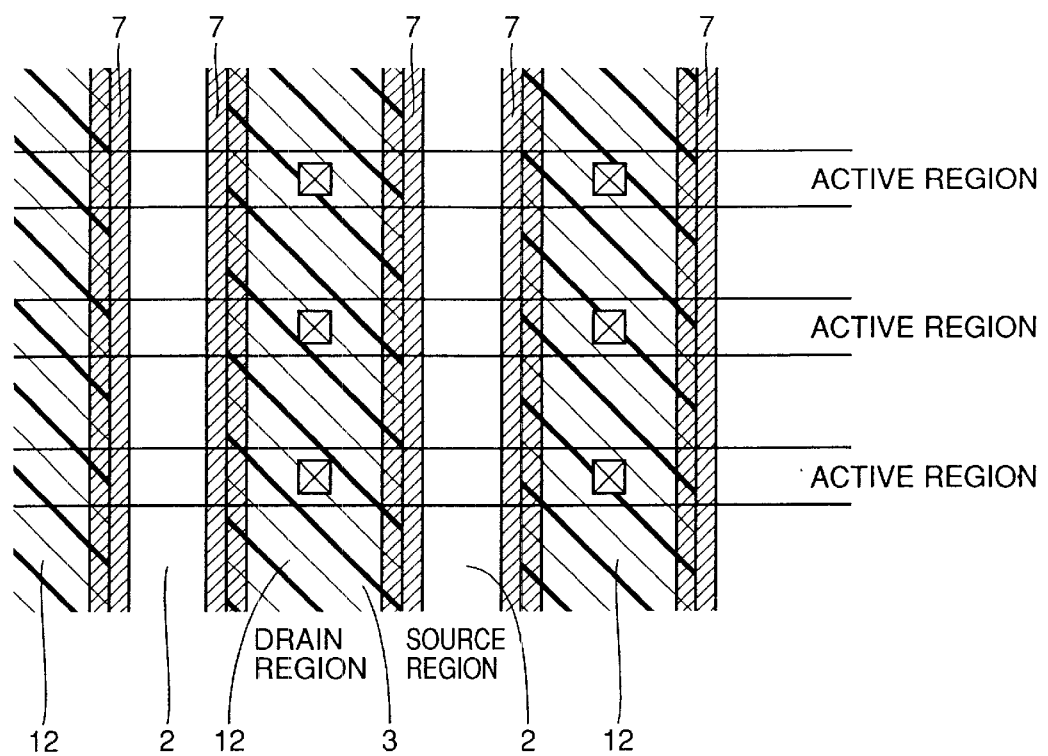
FIG. 17 is a conceptual view showing a method of forming self-aligned sources.
Figure 18:
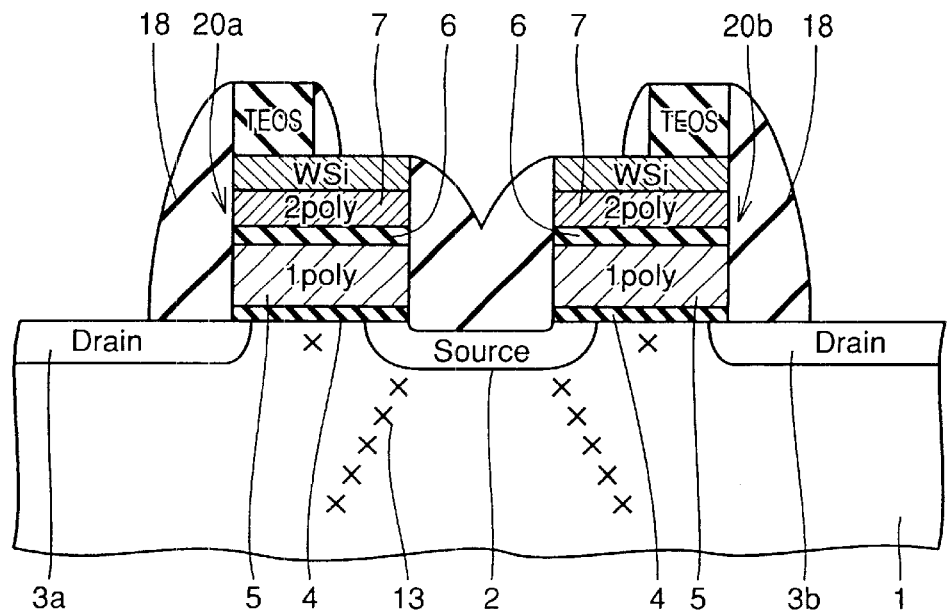
FIG. 18 is a view showing a problem with a NOR type flash memory according to a prior art.
Figure 19:
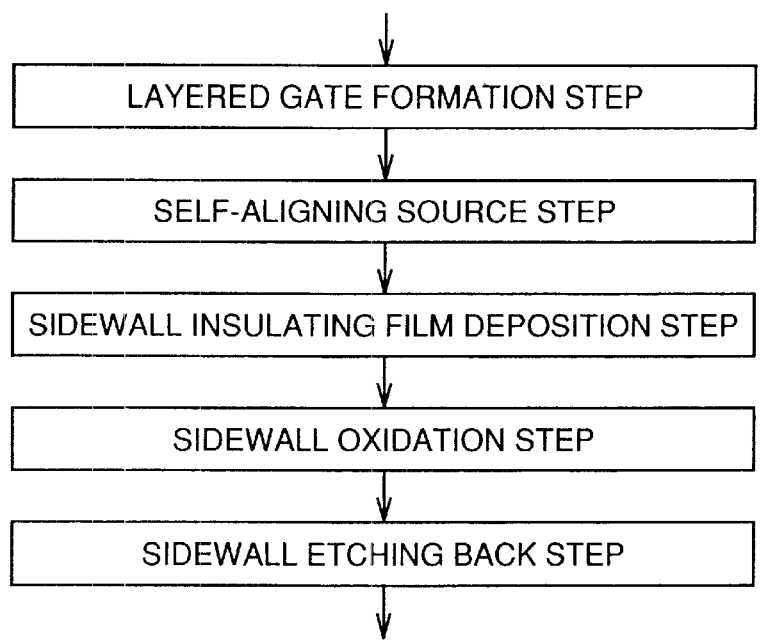
FIG. 19 is a diagram showing a process flow of a process for a NOR type flash memory according to a prior art.
Figure 20:
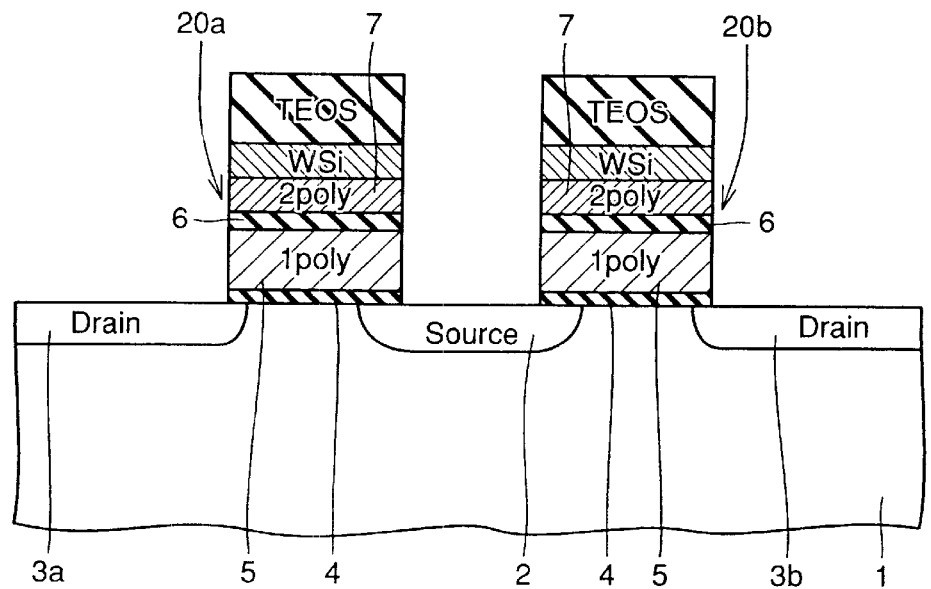
FIGS. 20 to 25 are cross section views showing the first to the sixth steps of a process for a NOR type flash memory according to a prior art.
Figure 21:
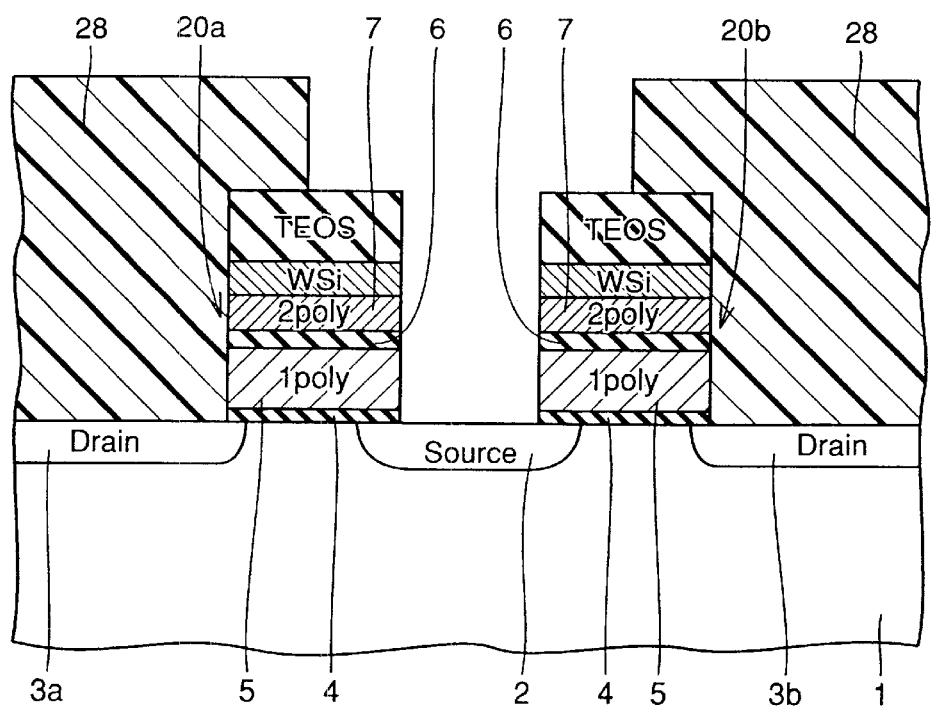
Figure 22:
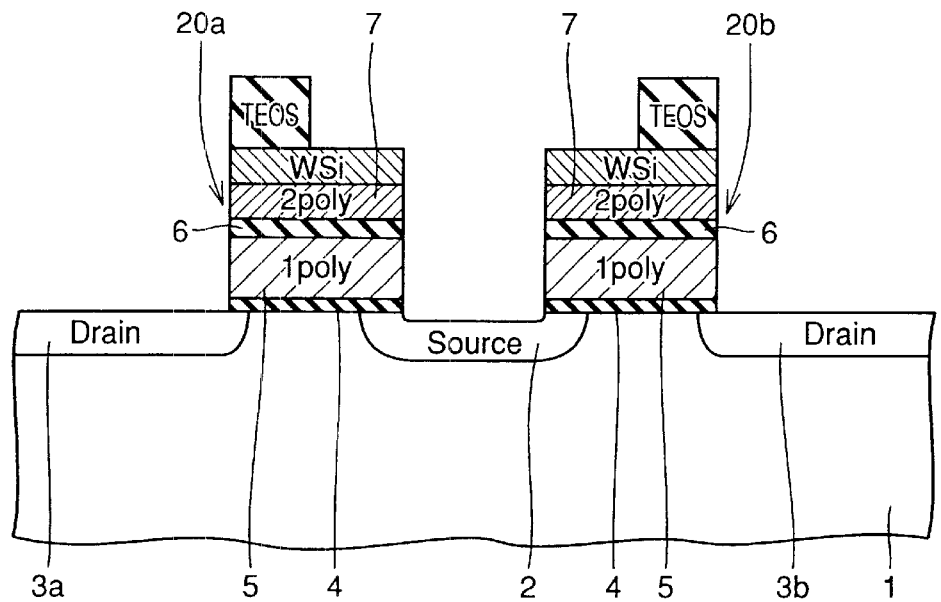
Figure 23:
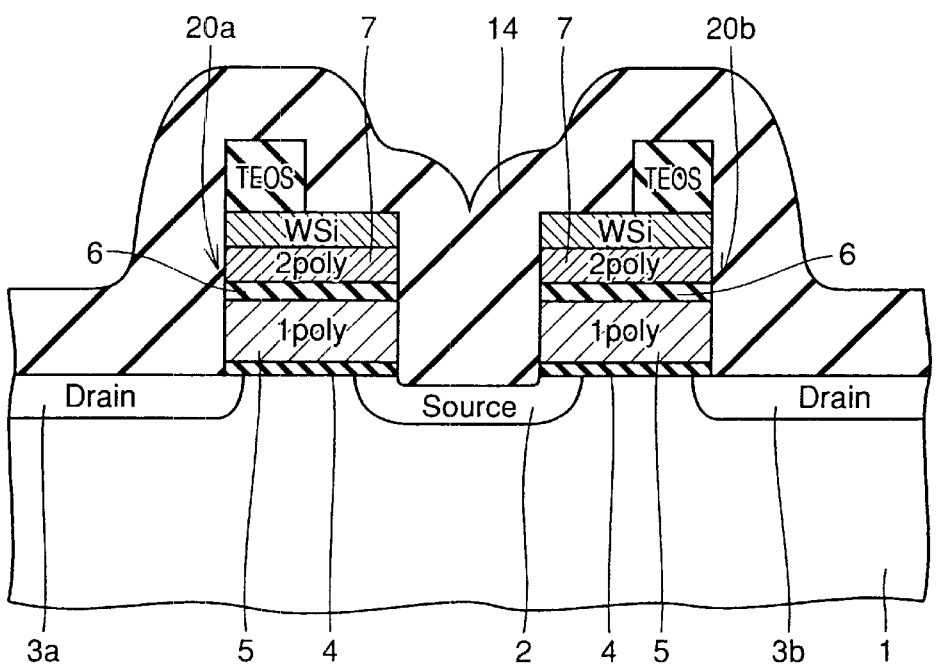
Figure 24:
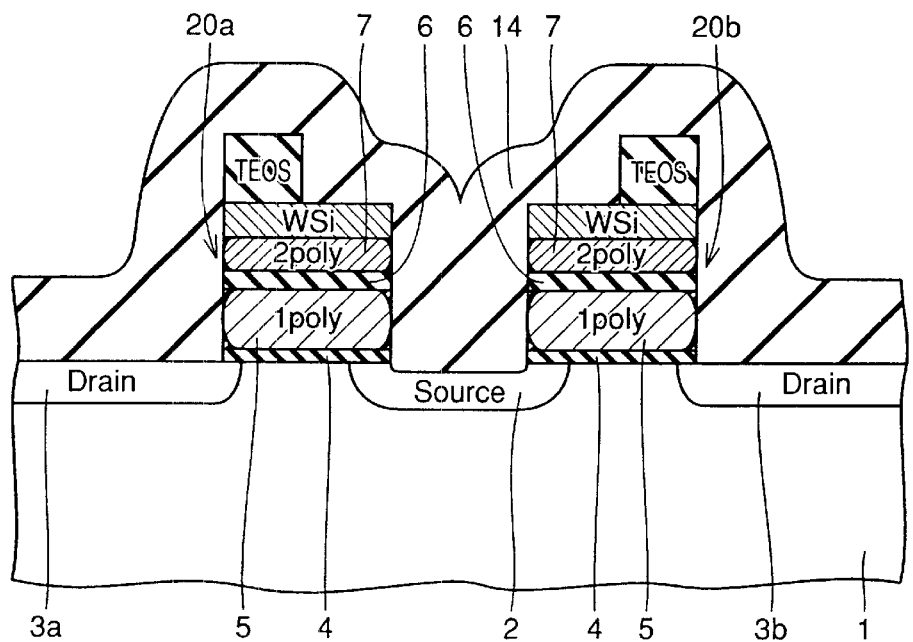
Figure 25:
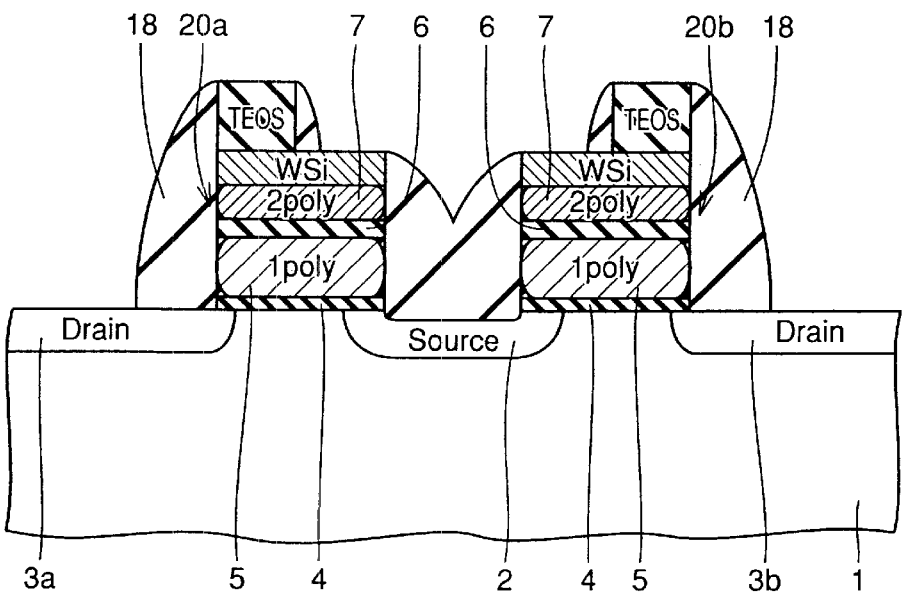
Figure 26:
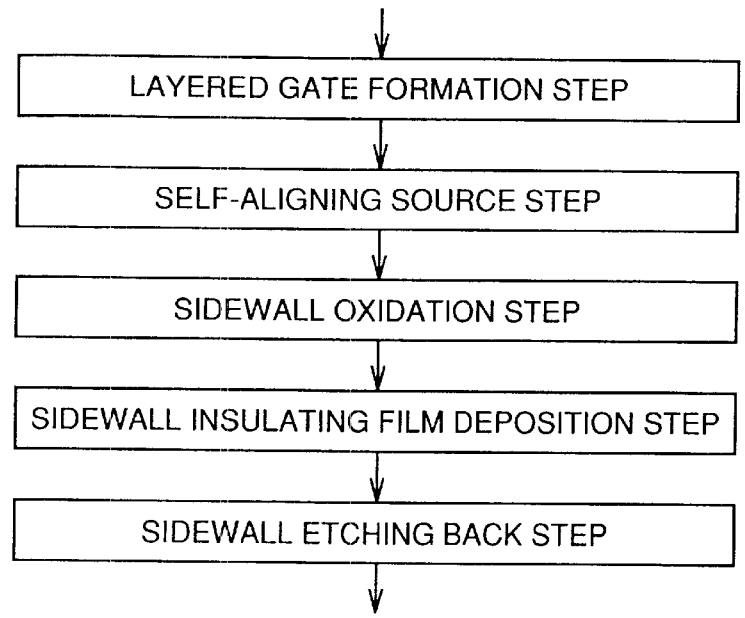
FIG. 26 is a diagram showing a process flow of a process for a NOR type flash memory according to another prior art.
Figure 27:
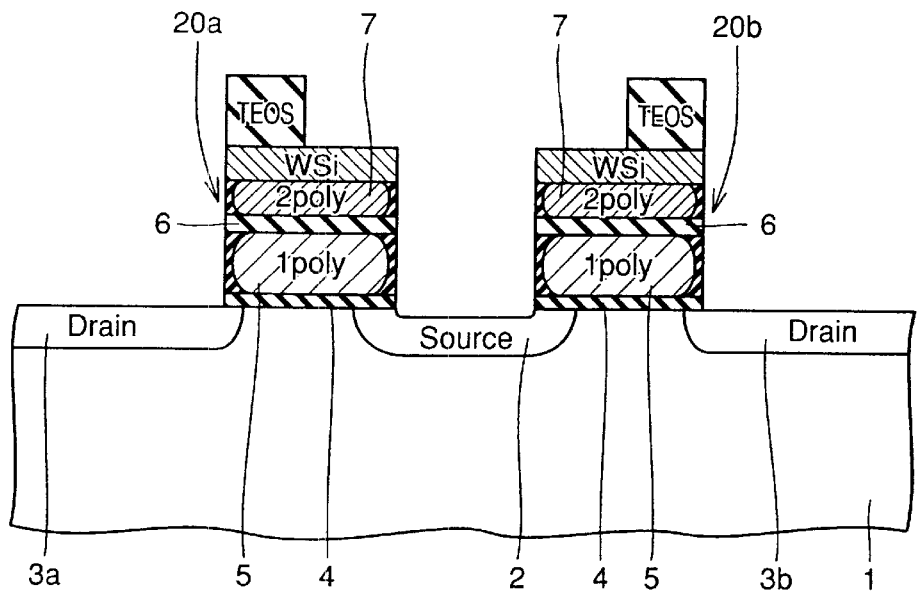
FIGS. 27 and 28 are cross section views showing the first and the second steps of a process for a NOR type flash memory according to another prior art.
Figure 28:
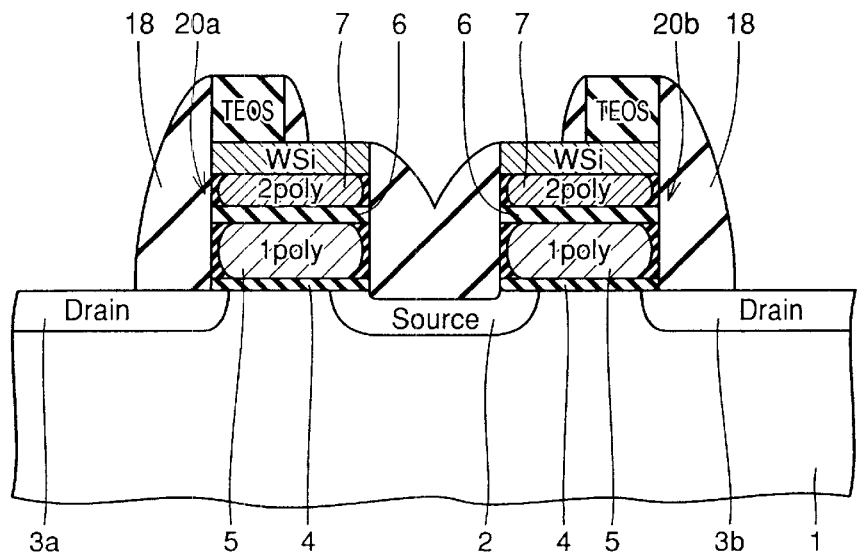
Figure 29:
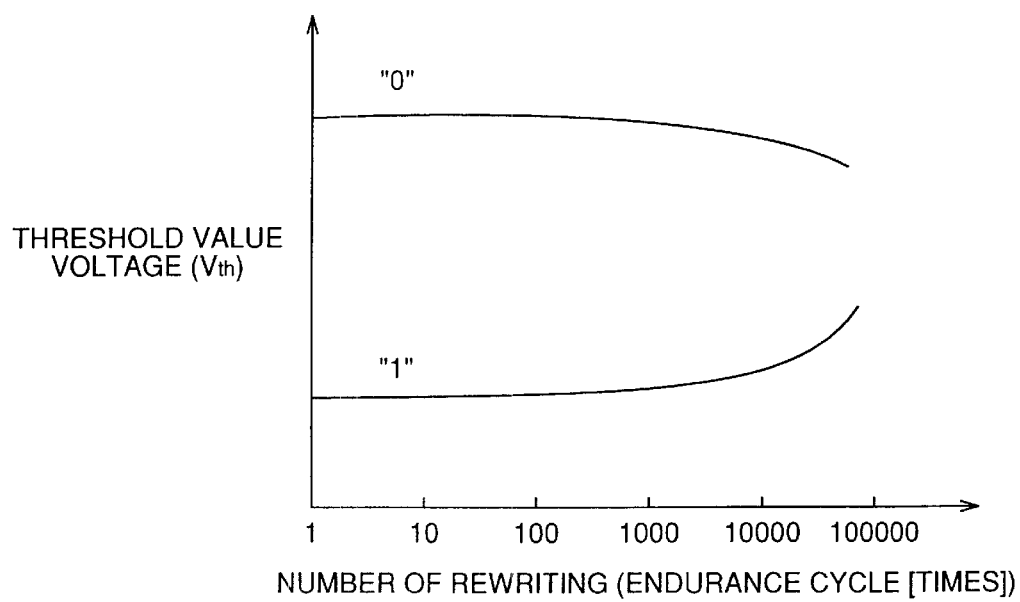
FIG. 29 is a diagram showing the endurance characteristics according to a prior art.

Next, referring to FIG. 10, the fourth embodiment according to the present invention is described. In the fourth embodiment, nitrogen is introduced only into the drains 3a, 3b. In the case of the fourth embodiment, it can be seen that, as shown in FIG. 10, the profile of nitrogen in the drains 3a, 3b shows the same tendency as of the profile of nitrogen in the first embodiment as shown in FIG. 2.

As described above, by introducing nitrogen into the drains 3a, 3b, the generation of the interface status density in the interface between the tunnel oxide film 4 and the semiconductor substrate 1 can be prevented. Accordingly, the fourth embodiment is useful for a memory structure wherein the crystal defects of the source 2 are hard to occur.

Next, a process for memory cell transistors in a NOR type flash memory of the fourth embodiment is described.

Through the same steps as in the case of the third embodiment, a resist 32, which covers the region for the formation of the source 2 and which exposes the regions for the formation of the drains 3a, 3b, is formed on the main surface of the semiconductor substrate 1.

By using this resist 32, the first and the second layered gates 20a, 20b as a mask, nitrogen of approximately $5 \times 10^{14}/cm^2$ to $5 \times 10^{16}/cm^2$ is injected aiming at the main surface of the semiconductor substrate 1 at a low energy level of, for example, approximately 0.5 keV to 40 keV.

Next, in the same method as in the first embodiment, the isolation oxide film of a part which is to become a diffusion layer wire is removed and As injection, B injection are carried out. Thereby, nitrogen can be introduced into the drains 3a, 3b so as to have the profile as shown in FIG. 10.

Here, the self-aligning source steps may be omitted in every embodiment. In this case, the step of removing the isolation oxide film between the sources of the memory cells is not necessary and a metal wire connected to each source 2 via a contact part is formed so that respective sources 2 are connected through this metal wire.

According to the present invention, at least one of the occurrence of crystal defects in the substrate inside or the generation of the interface status density in the interface between the tunnel insulating film and the substrate can be prevented. By preventing the occurrence of the crystal defects inside of the substrate, a leak current in the memory cell transistor can be constrained and the endurance characteristics, retention or the like, can be improved. In addition, by preventing the generation of the interface status density in the interface between the tunnel oxide film and the substrate, the fluctuation of Vth of the memory cell transistor due to the repetition of rewriting can be constrained so that the endurance characteristics, which are the withstanding characteristics for rewriting, can be improved. Accordingly the reliability of the nonvolatile semiconductor memory device can be improved.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A nonvolatile semiconductor memory device comprising:

a semiconductor substrate having a main surface; and a plurality of memory cell transistors which are formed above said main surface via a tunnel insulating film and which have sources and drains, wherein at least one of said sources and said drains include nitrogen of which a concentration peak is located in the vicinity of the surface of at least one of said sources or said drains.

2. The nonvolatile semiconductor memory device according to claim 1, wherein said nonvolatile semiconductor memory device is a NOR type nonvolatile semiconductor memory device.

3. The nonvolatile semiconductor memory device according to claim 1, wherein sources of adjoining said memory cell transistors are electrically connected to each other via an impurity diffusion layer formed in said main surface.

4. The nonvolatile semiconductor memory device according to claim 1, wherein said concentration peak of nitrogen is located within 100 nm from said substrate surface.

5. The nonvolatile semiconductor memory device according to claim 1, wherein said concentration peak of nitrogen is $1\times10^{19}$ cm$^{-3}$ or more and $1\times10^{22}$ cm$^{-3}$ or less.

6. The nonvolatile semiconductor memory device according to claim 1, wherein both of said sources and drains include said nitrogen and the concentration of said nitrogen included in said sources is not lower than the concentration of said nitrogen included in said drains.

7. The nonvolatile semiconductor memory device according to claim 1, wherein both of said sources and drains include said nitrogen and the concentration of said nitrogen included in said drains is higher than the concentration of said nitrogen included in said sources.

8. The nonvolatile semiconductor memory device according to claim 1, wherein only one of said sources and said drains include said nitrogen.

\* \* \* \* \*